(12) United States Patent
Briere et al.

(10) Patent No.: US 8,270,137 B2
(45) Date of Patent: Sep. 18, 2012

(54) INTERPOSER FOR AN INTEGRATED DC-DC CONVERTER

(75) Inventors: Michael A. Briere, Woonsocket, RI (US); Hamid Tony Bahramian, Torrance, CA (US); Jason Zhang, Monterey Park, CA (US)

(73) Assignee: International Rectifier Corporation, El Segundo, CA (US)

( * ) Notice: Subject to any disclaimer, the term of this patent is extended or adjusted under 35 U.S.C. 154(b) by 566 days.

(21) Appl. No.: 12/250,713

(22) Filed: Oct. 14, 2008

(65) Prior Publication Data

US 2009/0096289 A1 Apr. 16, 2009

Related U.S. Application Data

(60) Provisional application No. 60/979,903, filed on Oct. 15, 2007.

(51) Int. Cl.
*H02H 1/00* (2006.01)

(52) U.S. Cl. ........................................ 361/100; 257/779

(58) Field of Classification Search ............... 257/779, 257/780, 784, E23.067, E23.004; 323/222, 323/223, 224, 282, 351; 361/100, 760
See application file for complete search history.

(56) References Cited

U.S. PATENT DOCUMENTS

| | | |
|---|---|---|
| 5,347,571 A | 9/1994 | Furbee et al. |
| 7,132,818 B2 | 11/2006 | Matsuura |
| 7,174,467 B1 | 2/2007 | Helms et al. |
| 7,247,930 B2 | 7/2007 | Narendra et al. |
| 7,268,419 B2 | 9/2007 | Cornelius |
| 7,334,326 B1 | 2/2008 | Huemoeller et al. |
| 2005/0105225 A1 | 5/2005 | Ahn et al. |
| 2007/0158787 A1 | 7/2007 | Chanchani |

*Primary Examiner* — Thomas L Dickey
(74) *Attorney, Agent, or Firm* — Farjami & Farjami LLP

(57) ABSTRACT

An interposer electrical interface for placing a DC-DC converter in close proximity with an IC powered by the converter, the DC-DC converter including at least one switching node power supply stage, the at least one switching node power supply stage providing regulated power to the IC, the close proximity of the DC-DC converter and IC allowing for high efficiency in provision of the regulated power from the DC-DC converter to the IC, the interposer electrical interface comprising at least one electrical energy storage element.

8 Claims, 1 Drawing Sheet

INTERPOSER FOR AN INTEGRATED DC-DC CONVERTER

CROSS-REFERENCE TO RELATED APPLICATION

This application is based on and claims priority to U.S. Provisional Patent Application Ser. No. 60/979,903, filed on Oct. 15, 2007 and entitled INTERPOSER FOR A HIGHLY INTEGRATED DC-DC CONVERTER, the entire contents of which is hereby incorporated by reference.

BACKGROUND OF THE INVENTION

The present invention relates to DC-DC converters and more particularly to an interposer electrical interface used to more closely integrate a DC-DC converter and an IC for which the DC-DC converter performs voltage regulation.

Designers of electrical systems are continuously seeking ways that allow for a reduction of system footprint, i.e., the area required for power management elements and further integration of various system functions leading to reduction of costs. In particular, the energy storage elements, e.g., inductors, consume area in a converter and it is desirable to reduce the amount of space dedicated to these storage elements.

Improvements in high performance systems have been described. For example, U.S. Pat. No. 7,247,930, discloses a power management die including a voltage regulator module (VRM) bonded to a CPU die that includes multiple cores. U.S. Pat. No. 7,268,419 describes an interposer that reduces the effects of voltage noise sandwiched between an IC and a circuit board. As described, the interposer includes a plurality of bypass capacitors integrated into the interposer and coupled between the power and ground connections for the IC device, to reduce voltage noise between the power and ground connections for the IC device.

What is needed, is a way to use an interposer electrical interface to separate devices, such as DC-to-DC converters, included in voltage regulator modules (VRMs), and ICs to which these converters are connected so as to enable circuit design wherein the converters are positioned closer to the ICs and that allows the inductor to be integrated in the interposer.

SUMMARY OF THE INVENTION

It is an object of the present invention to provide an interposer that allows a high performance DC-DC converter to be integrated with the IC device that it powers, velocity integration of the necessary converter storage elements, e.g., inductors and capacitors.

Provided is an interposer electrical interface for placing a DC-DC converter in close proximity with an IC, the DC-DC converter including at least one switching node power supply stage, the at least one switching node power supply stage providing regulated power to the IC, the close proximity of the DC-DC converter and IC allowing for high efficiency in provision of the regulated power from the DC-DC converter to the IC, the interposer electrical interface including at least one electrical energy storage element.

Other features and advantages of the present invention will become apparent from the following description of the invention that refers to the accompanying drawings.

DETAILED DESCRIPTION OF EMBODIMENTS OF THE INVENTION

The present invention provides an interposer electrical interface, for placing a high performance DC-DC converter, e.g., a VRM, in close proximity with an IC, such as, a microprocessor, e.g., a microprocessor with multiple cores, so that regulated power can be provided from the converter to the IC with high efficiency. The DC-DC converter may include a significant number of outputs, e.g., 64, for feeding multiple CPU cores of the IC.

Figure 1:
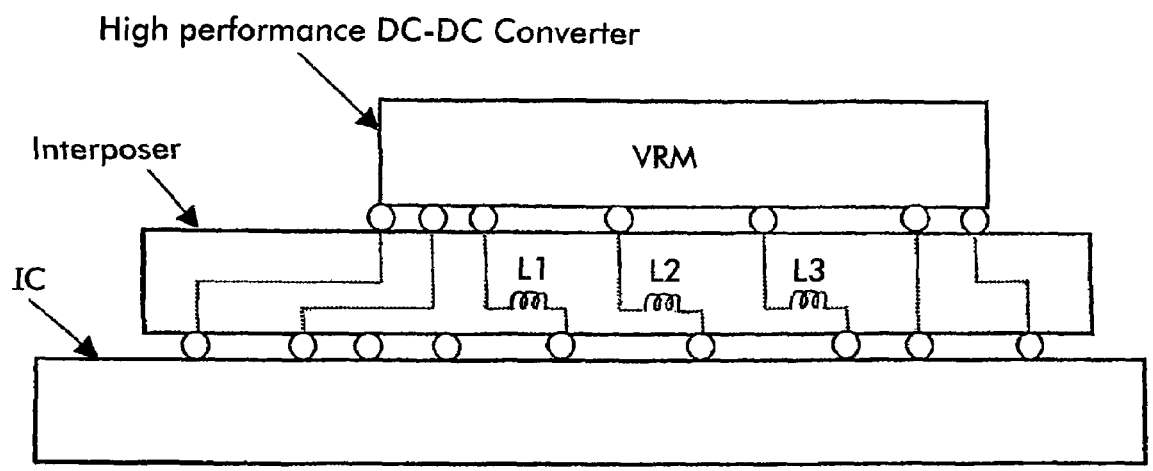
FIG. 1 is a block diagram showing an interposer of the present invention positioned between an IC and a DC-DC converter.

As illustrated in FIG. 1, in addition to output capacitors, the interposer electrical interface includes inductive storage elements that connect the DC-DC converter outputs to the IC. The interposer electrical interface incorporates a ferrite or other magnetic material for forming a highly effective inductor.

Figure 2:
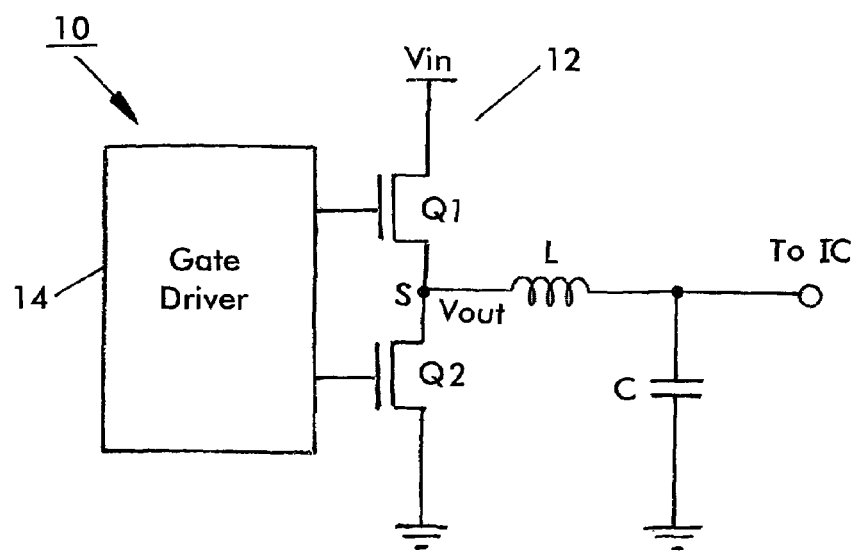
FIG. 2 is a diagram of a DC-DC converter of the prior art.

FIG. 2 shows the block diagram of a single converter output. The converter is a buck converter and includes at least one stage 12 having two transistors Q1 and Q2, e.g., MOSFETs, series connected at a node S and coupled to voltage bus $V_{in}$ and generating output voltage $V_{out}$. The input voltage $V_{in}$ is converted, when the two high and low transistors Q1 and Q2 are complementary switched by a gate driver 14, into the output voltage $V_{out}$, which is provided to power a load, e.g., a CPU. Energy storage elements L and C are provided to filter the output voltage.

A high performance, highly integrated DC-DC converter enables reduction of the size of the inductor L. According to the invention, the inductor storage elements are integrated inside the interposer as inductors $L_1$, $L_2$, $L_3$, etc. The output capacitors, not shown in FIG. 1, can also be integrated in the interposer.

The interposer according to the invention provides substantial benefits, including reduction in footprint and area required for power management elements and thus allow favorable integration of functions and reduction of costs. By placing the VRM in close proximity to the powered IC, the circuit layout size and conductor usage is reduced, thereby reducing costs and improving circuit efficiency by reducing losses due to parasitic impedances.

As shown in FIG. 1, the interposer can be connected between the VRM and the IC by solder balls or any other known technique. The inductors are provided as ferrite or other magnetic material in the interposer, which can be made from any suitable dielectric material. Some of the connections are not shown with inductors, in which case the inductance is provided by the circuit inductors themselves.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. An interposer electrical interface comprising a substrate between a DC-DC converter and an IC powered by the converter to provide close proximity of the DC-DC converter and IC, the DC-DC converter including at least one switching node power supply stage, the at least one switching node power supply stage providing regulated power to the IC, the close proximity of the DC-DC converter and IC allowing for high efficiency in provision of the regulated power from the DC-DC converter to the IC, the interposer electrical interface further comprising at least one electrical energy storage element within the substrate and in electrical contact to the at least one switching node power supply stage.

2. The interposer electrical interface of claim 1, wherein the at least one electrical energy storage elements comprises an at least one inductive storage element.

3. The interposer electrical interface of claim 2, wherein the at least one electrical energy storage element comprises at least one output capacitor connected to the at least one inductive storage element, wherein a combination of the at least one output capacitor and inductive storage element is an LC filter of the DC-DC converter.

4. The interposer electrical interface of claim 2, wherein the inductive storage element comprises a magnetic material and the substrate comprises a dielectric material.

5. The interposer electrical interface of claim 4, wherein the magnetic material comprises ferrite.

6. The interposer electrical interface of claim 1, wherein the IC comprises a multiple core microprocessor having a plurality of processor cores, the DC-DC converter including a plurality of outputs for powering said plurality of processor cores.

7. The interposer electrical interface of claim 1, further comprising electrical connection at the interposer electrical interface between the converter and the interface and between the interface and the IC.

8. The interposer electrical interface of claim 7, wherein the electrical connectors comprise solder balls.

* * * * *